United States Patent
Hu et al.

(10) Patent No.: US 9,129,905 B2
(45) Date of Patent: Sep. 8, 2015

(54) PLANAR METROLOGY PAD ADJACENT A SET OF FINS OF A FIN FIELD EFFECT TRANSISTOR DEVICE

(71) Applicant: GLOBALFOUNDRIES Inc., Grand Cayman (KY)

(72) Inventors: Xiang Hu, Clifton Park, NY (US); Lokesh Subramany, Clifton Park, NY (US); Alok Vaid, Ballston Lake, NY (US); Sipeng Gu, Clifton Park, NY (US); Akshey Sehgal, Malta, NY (US)

(73) Assignee: GlobalFoundries Inc., Grand Cayman (KY)

( * ) Notice: Subject to any disclaimer, the term of this patent is extended or adjusted under 35 U.S.C. 154(b) by 40 days.

(21) Appl. No.: 14/070,624

(22) Filed: Nov. 4, 2013

(65) Prior Publication Data

US 2015/0123212 A1      May 7, 2015

(51) Int. Cl.
*H01L 21/308* (2006.01)
*H01L 29/66* (2006.01)
*H01L 29/78* (2006.01)

(52) U.S. Cl.
CPC ...... *H01L 21/3086* (2013.01); *H01L 29/66795* (2013.01); *H01L 29/785* (2013.01)

(58) Field of Classification Search
CPC .................... H01L 29/66795; H01L 29/66772
USPC .................. 438/157, 703; 257/797, E23.179, 257/E21.233
See application file for complete search history.

(56) References Cited

U.S. PATENT DOCUMENTS

| 8,779,511 B2 | 7/2014 | Kanike et al. | |
| 2014/0065832 A1* | 3/2014 | Hsieh et al. | 438/703 |
| 2014/0120701 A1* | 5/2014 | Basker et al. | 438/478 |
| 2014/0193955 A1 | 7/2014 | Currie | |

* cited by examiner

*Primary Examiner* — Selim Ahmed
*Assistant Examiner* — Changhyun Yi
(74) *Attorney, Agent, or Firm* — Williams Morgan, P.C.

(57) ABSTRACT

Approaches for providing a planar metrology pad adjacent a set of fins of a fin field effect transistor (FinFET) device are disclosed. A previously deposited amorphous carbon layer can be removed from over a mandrel that has been previously formed on a subset of a substrate, such as using a photoresist. A pad hardmask can be formed over the mandrel on the subset of the substrate. This formation results in the subset of the substrate having the pad hardmask covering the mandrel thereon and the remainder of the substrate having the amorphous carbon layer covering the mandrel thereon. This amorphous carbon layer can be removed from over the mandrel on the remainder of the substrate, allowing a set of fins to be formed therein while the amorphous carbon layer keeps the set of fins from being formed in the portion of the substrate that it covers.

15 Claims, 14 Drawing Sheets

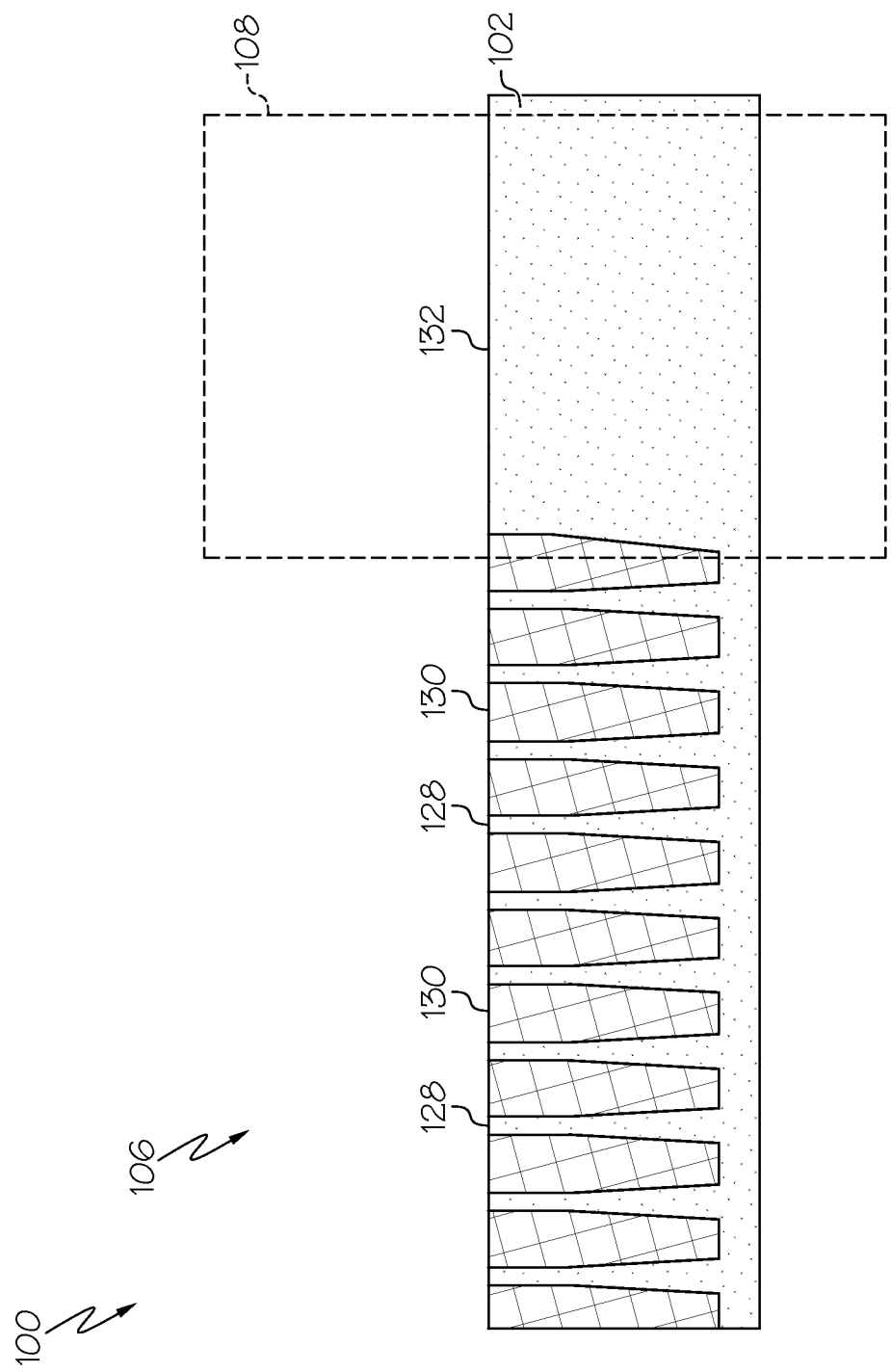

PLANAR METROLOGY PAD ADJACENT A SET OF FINS OF A FIN FIELD EFFECT TRANSISTOR DEVICE

BACKGROUND

1. Technical Field

This invention relates generally to the field of semiconductors, and more particularly, to providing a substrate having a planar metrology pad adjacent a set of fins of a fin field effect transistor (FinFET) device.

2. Related Art

A typical integrated circuit (IC) chip includes a stack of several levels or sequentially formed layers of shapes. Each layer is stacked or overlaid on a prior layer and patterned to form the shapes that define devices (e.g., fin field effect transistors (FinFETs)) and connect the devices into circuits. In a typical state of the art complementary insulated gate FinFET process, such as what is normally referred to as CMOS, layers are formed on a wafer to form the devices on a surface of the wafer. Further, the surface may be the surface of a silicon layer on a silicon on insulator (SOI) wafer. A simple FinFET includes a gate layer rectangle on a silicon island formed from the silicon surface layer. Each of these layers of shapes, also known as mask levels or layers, may be created or printed optically through well-known photolithographic masking, developing and level definition (e.g., etching, implanting, deposition, etc.). In some approaches, fins of the FinFET are created by a process that is similar to self-aligned double patterning. The process involves patterning of a spacer and deposition of liners on top of one or more hardmasks. The spacer is then etched away, followed by the hardmask, leaving behind fins. However, it currently is not possible to obtain a FIN-free region due to the nature of the hardmask etch process.

Optical metrology is commonly employed in process control applications in the semiconductor manufacturing industry due to optical metrology's non-contact and non-destructive nature. FinFETs raise new metrology complexities, as the entire 3D structure becomes critical for process control, including fin and gate dimensions, profiles and roughness, and metal gate undercuts. Due to the finification process of FinFET devices, metrology models must now take into account the fins underlying the planar metrology pad, which provides additional challenges, and may lead to insufficient results.

SUMMARY

In general, approaches for providing a planar metrology pad adjacent a set of fins of a fin field effect transistor (FinFET) device are disclosed. A previously deposited amorphous carbon layer can be removed from over a mandrel that has been previously formed on a subset of a substrate, such as using a photoresist. A pad hardmask can be formed over the mandrel on the subset of the substrate. This formation results in the subset of the substrate having the pad hardmask covering the mandrel thereon and the remainder of the substrate having the amorphous carbon layer covering the mandrel thereon. This amorphous carbon layer can be removed from over the mandrel on the remainder of the substrate, allowing a set of fins to be formed therein while the amorphous carbon layer keeps the set of fins from being formed in the portion of the substrate that it covers.

One aspect of the present invention includes a method for forming a device, the method comprising: removing an amorphous carbon layer from over a mandrel formed on a subset of a substrate; forming a pad hardmask over the mandrel on the subset of the substrate, wherein the forming results in the pad hardmask covering the mandrel on the subset of the substrate and the amorphous carbon layer covering the mandrel on a remainder of the substrate; removing the amorphous carbon layer from over the mandrel on the remainder of the substrate; and forming a set of fins in the remainder of the substrate, wherein the amorphous carbon layer keeps the set of fins from being formed in the subset of the substrate.

Another aspect of the present invention includes a method for forming a planar metrology pad on a substrate of a fin field effect transistor (FinFET) device, the method comprising: removing an amorphous carbon layer from over a mandrel formed on a subset of a substrate; forming a pad hardmask over the mandrel on the subset of the substrate, wherein the forming results in the pad hardmask covering the mandrel on the subset of the substrate and the amorphous carbon layer covering the mandrel on a remainder of the substrate; removing the amorphous carbon layer from over the mandrel on the remainder of the substrate; and forming a set of fins in the remainder of the substrate, wherein the amorphous carbon layer keeps the set of fins from being formed in the subset of the substrate.

Yet another aspect of the present invention includes a fin field effect transistor (FinFET) device, comprising: a set of fins patterned in a substrate of the FinFET device; and a planar metrology pad formed adjacent to the set of fins in a metrology measurement area of the FinFET device, wherein the planar metrology pad is substantially flat and oriented substantially perpendicular to the set of fins.

BRIEF DESCRIPTION OF THE DRAWINGS

These and other features of this invention will be more readily understood from the following detailed description of the various aspects of the invention taken in conjunction with the accompanying drawings in which:

FIG. 14 shows a cross-sectional view of the device following deposition of an oxide and planarization according to illustrative embodiments.

Figure 1:
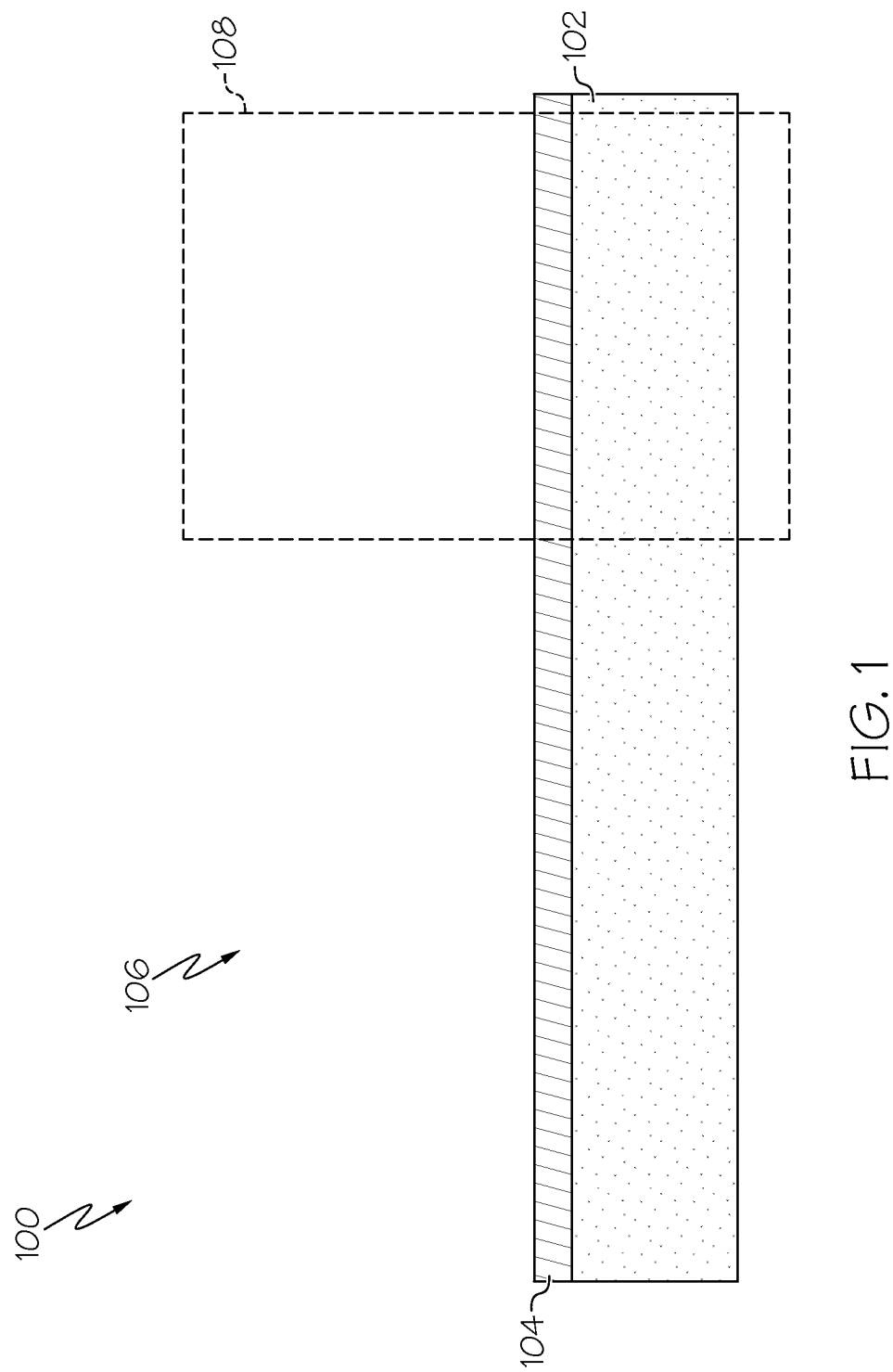
FIG. 1 shows a cross-sectional view of the formation of a hardmask over a substrate of a FinFET device according to illustrative embodiments.

The drawings are not necessarily to scale. The drawings are merely representations, not intended to portray specific parameters of the invention. The drawings are intended to depict only typical embodiments of the invention, and therefore should not be considered as limiting in scope. In the drawings, like numbering represents like elements.

DETAILED DESCRIPTION

Exemplary embodiments will now be described more fully herein with reference to the accompanying drawings, in which exemplary embodiments are shown. It will be appreciated that this disclosure may be embodied in many different forms and should not be construed as limited to the exemplary embodiments set forth herein. Rather, these exemplary embodiments are provided so that this disclosure will be thorough and complete and will fully convey the scope of this disclosure to those skilled in the art.

Described herein are approaches for providing a planar metrology pad adjacent a set of fins of a fin field effect transistor (FinFET) device. A previously deposited amorphous carbon layer can be removed from over a mandrel that has been previously formed on a subset of a substrate, such as using a photoresist. A pad hardmask can be formed over the mandrel on the subset of the substrate. This formation results in the subset of the substrate having the pad hardmask covering the mandrel thereon and the remainder of the substrate having the amorphous carbon layer covering the mandrel thereon. This amorphous carbon layer can be removed from over the mandrel on the remainder of the substrate, allowing a set of fins to be formed therein while the amorphous carbon layer keeps the set of fins from being formed in the portion of the substrate that it covers.

The terminology used herein is for the purpose of describing particular embodiments only and is not intended to be limiting of this disclosure. For example, as used herein, the singular forms "a", "an", and "the" are intended to include the plural forms as well, unless the context clearly indicates otherwise. Furthermore, the use of the terms "a", "an", etc., do not denote a limitation of quantity, but rather denote the presence of at least one of the referenced items. It will be further understood that the terms "comprises" and/or "comprising", or "includes" and/or "including", when used in this specification, specify the presence of stated features, regions, integers, steps, operations, elements, and/or components, but do not preclude the presence or addition of one or more other features, regions, integers, steps, operations, elements, components, and/or groups thereof.

Reference throughout this specification to "one embodiment," "an embodiment," "embodiments," "exemplary embodiments," or similar language means that a particular feature, structure, or characteristic described in connection with the embodiment is included in at least one embodiment of the present invention. Thus, appearances of the phrases "in one embodiment," "in an embodiment," "in embodiments" and similar language throughout this specification may, but do not necessarily, all refer to the same embodiment.

The terms "overlying" or "atop", "positioned on" or "positioned atop", "underlying", "beneath" or "below" mean that a first element, such as a first structure, e.g., a first layer, is present on a second element, such as a second structure, e.g. a second layer, wherein intervening elements, such as an interface structure, e.g. interface layer, may be present between the first element and the second element.

As used herein, "depositing" may include any now known or later developed techniques appropriate for the material to be deposited including but not limited to, for example: chemical vapor deposition (CVD), low-pressure CVD (LPCVD), plasma-improved CVD (PECVD), semi-atmosphere CVD (SACVD) and high density plasma CVD (HDPCVD), rapid thermal CVD (RTCVD), ultra-high vacuum CVD (UH-VCVD), limited reaction processing CVD (LRPCVD), metal-organic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation, etc.

Referring now to the figures, FIG. 1 shows a cross-sectional view of a device 100 according to an embodiment of the invention. Device 100 (e.g., a FinFET device) comprises a substrate 102 and a hardmask 104 formed over substrate 102. The term "substrate" as used herein is intended to include a semiconductor substrate, a semiconductor epitaxial layer deposited or otherwise formed on a semiconductor substrate and/or any other type of semiconductor body, and all such structures are contemplated as falling within the scope of the present invention. For example, the semiconductor substrate may comprise a semiconductor wafer (e.g., silicon, SiGe, or an SOI wafer) or one or more die on a wafer, and any epitaxial layers or other type semiconductor layers formed thereover or associated therewith. A portion or entire semiconductor substrate may be amorphous, polycrystalline, or single-crystalline. In addition to the aforementioned types of semiconductor substrates, the semiconductor substrate employed in the present invention may also comprise a hybrid oriented (HOT) semiconductor substrate in which the HOT substrate has surface regions of different crystallographic orientation. The semiconductor substrate may be doped, undoped, or contain doped regions and undoped regions therein. The semiconductor substrate may contain regions with strain and regions without strain therein, or contain regions of tensile strain and compressive strain.

In one embodiment, hardmask 104 may comprise either silicon nitride (SiN) or silicon dioxide (SiO2), or any other material(s) suitable as a hardmask, including silicon oxynitride (SiON), siliocon oxycarbide (SiOC), and the like. Hardmask 104 can be prepared by PVD, CVD, spin coating, etc., depending on the material. It will be appreciated that hardmask 104 may include an alignment mark (not shown) due to its high optical contrast (e.g., 14%-35%).

Figure 2:
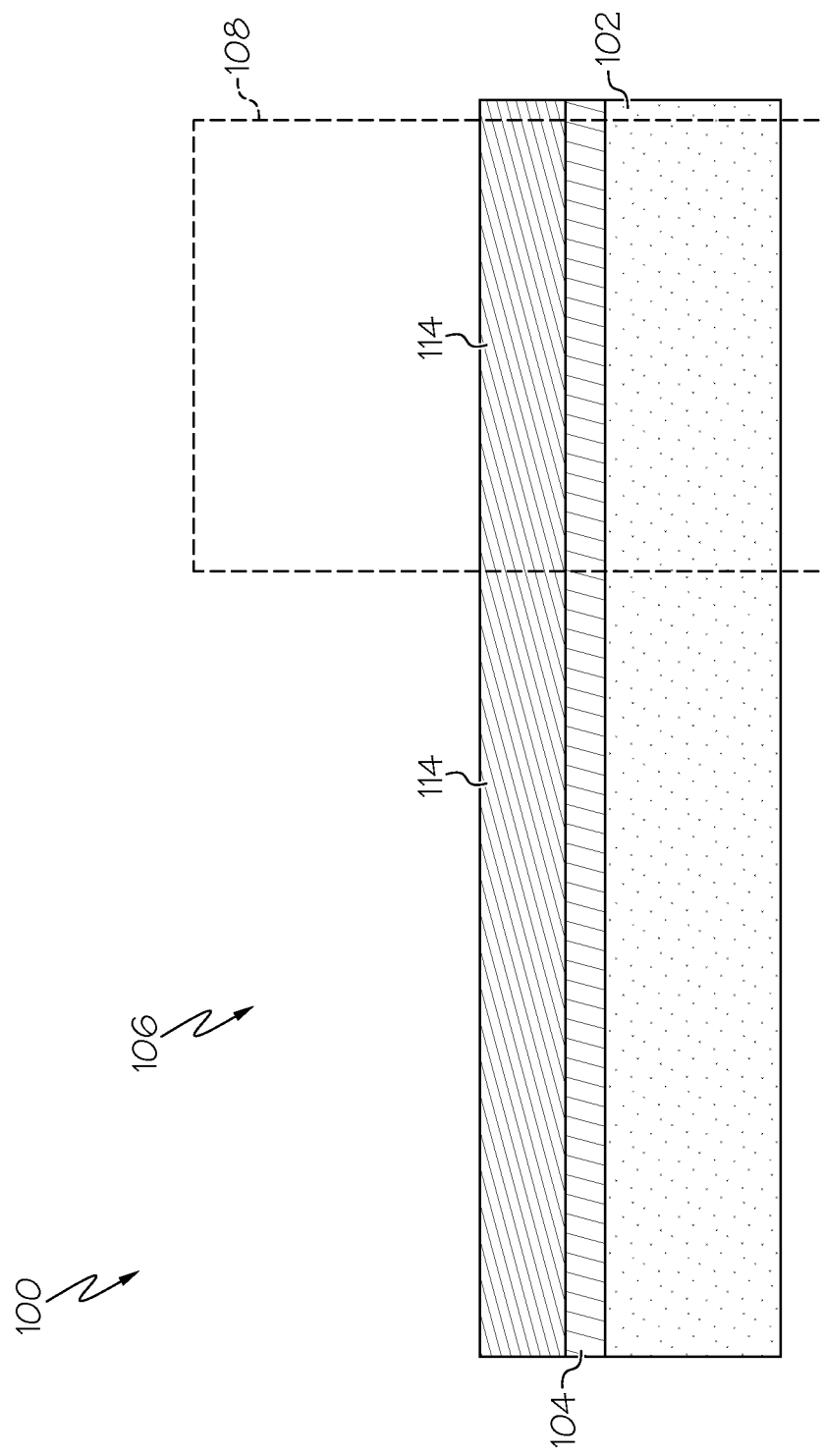
FIG. 2 shows a cross-sectional view of the formation of a mandrel layer over the device according to illustrative embodiments.

Next, as shown in FIG. 2, a mandrel layer 114 is formed over device 100. In various embodiments, mandrel layer 114 may comprise an inorganic and/or dielectric material such as amorphous silicon, polycrystalline silicon, or silicon oxide ($SiO_x$) where x is a number greater than zero, silicon nitride ($Si_3N_4$), silicon oxynitride (SiON), or the like. Mandrel layer 114 may be deposited using physical vapor deposition (PVD), CVD, plasma-improved chemical vapor deposition (PECVD), atmospheric pressure chemical vapor deposition (APCVD), low-pressure CVD (LPCVD), high density plasma CVD (HD CVD), atomic layer CVD (ALCVD), and/or other suitable processes.

Figure 3:
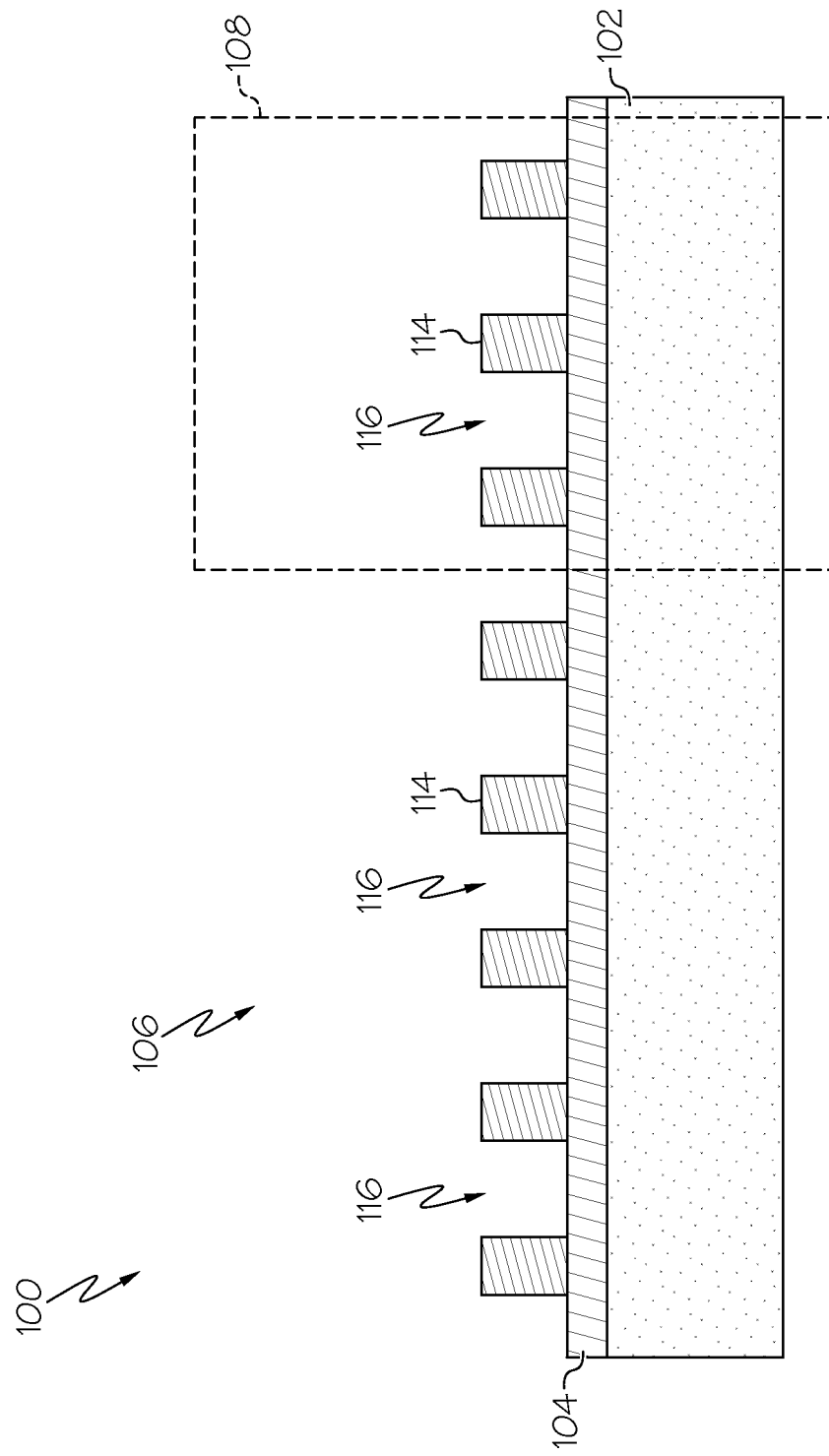
FIG. 3 shows a cross-sectional view of the patterning of a set of openings in the mandrel layer according to illustrative embodiments.

Next, as shown in FIG. 3, mandrel layer 114 is patterned to form a set of openings 116 therein, e.g., using a photo-lithography process or other lithographic process (e.g., electron beam lithography, imprint lithography, EUV lithography, etc.), and removed by a suitable etching process including a wet etch, dry etch, plasma etch, and the like.

Figure 4:
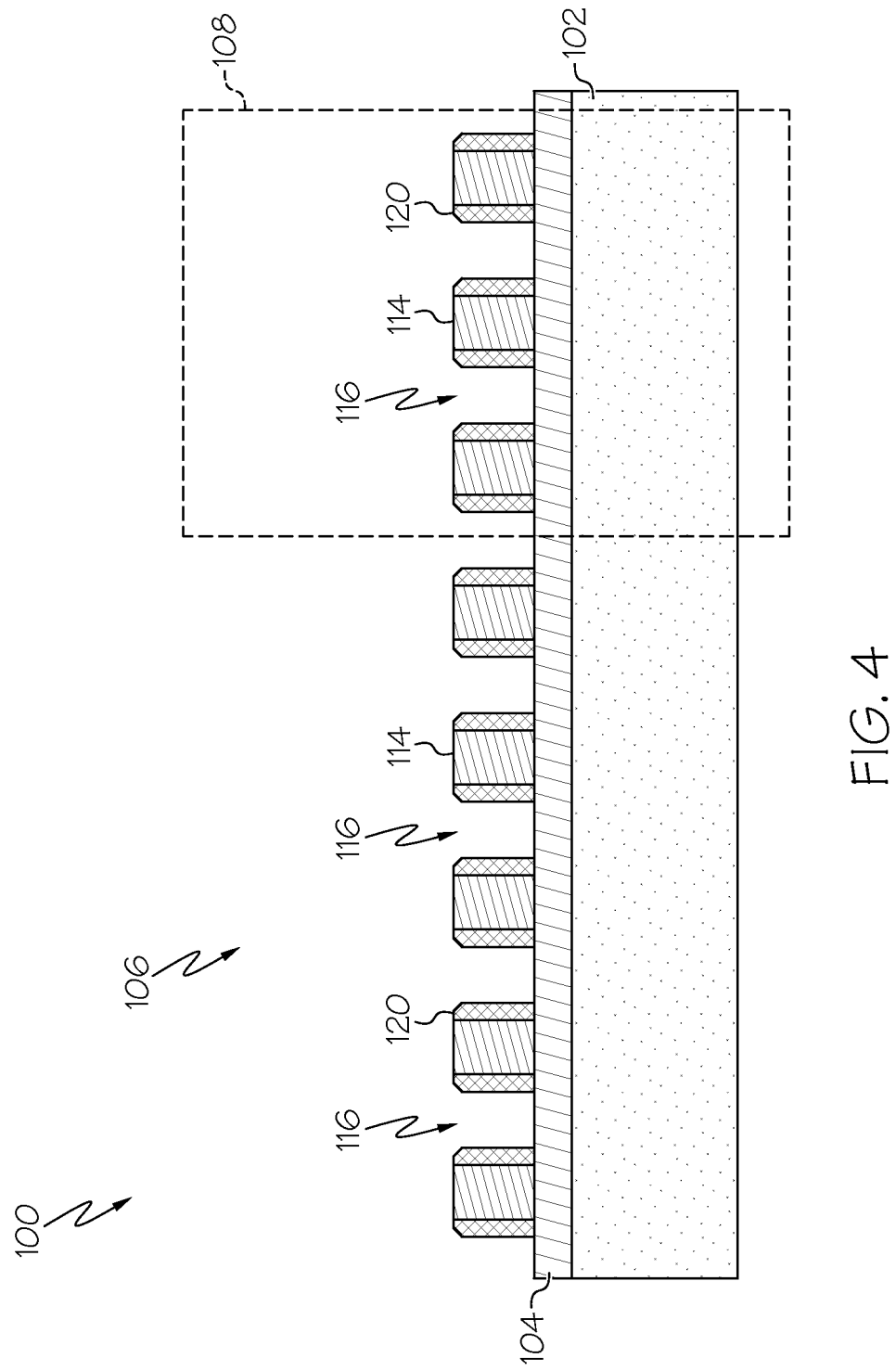
FIG. 4 shows a cross-sectional view of the formation of a set of spacers according to illustrative embodiments.

As shown in FIG. 4, a set of spacers 120 is then formed within each opening 116 along sidewalls of the patterned mandrel layer 114. As is known, spacers 120 provide a protective dielectric layer on the sidewalls of mandrel layer 114. In one embodiment, the material of each spacer 120 is selected to provide a material that will not be substantially etched by the etchant that subsequently removes mandrel layer 114. In one embodiment, set of spacers 120 comprises an oxide, and is formed using a sidewall image transfer (SIT) atomic layer deposition (ALD), and etch processes.

In current solutions, the formation of the set of spacers is often followed straightway by removal of the mandrel layer 114 from between each set of spacers 120 and subsequent etching to form a set of fins. However, the inventors of the current invention have discovered certain drawbacks to the current solutions. For example, these solutions often result in a finification of the entirety of the substrate. This completely finned substrate can prove to be inadequate if the use of metrology techniques is desired. Such metrology techniques require the presence of a uniform pad surface (e.g., of a Si based substrate). This uniform pad surface can be difficult to create in conjunction with the current completely finned solutions.

Figure 5:
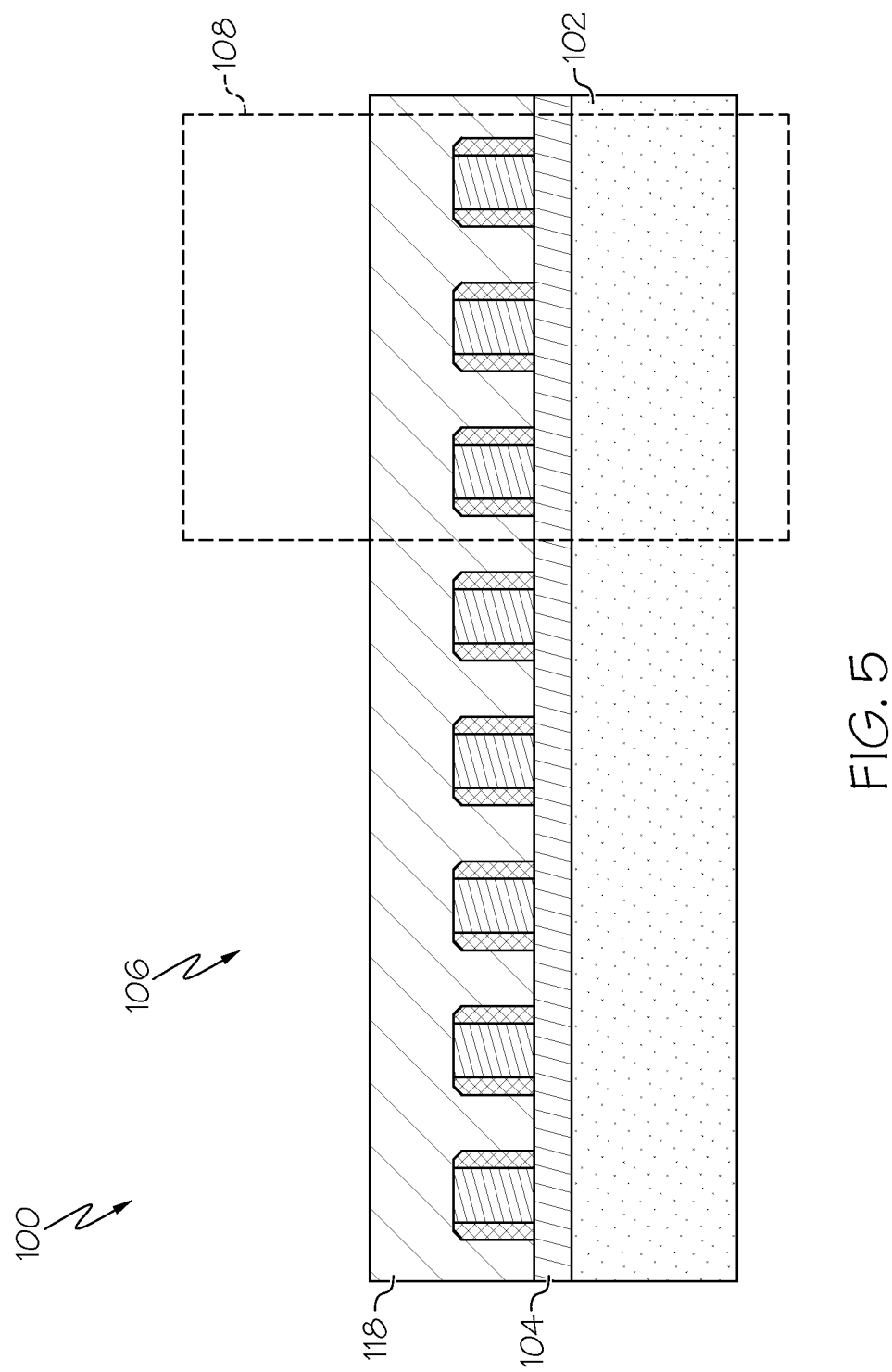
FIG. 5 shows a cross-sectional view of the formation of an amorphous carbon layer over the device according to illustrative embodiments.

Referring now to FIG. 5, an amorphous carbon layer 118 is formed over device 100. In various embodiments, amorphous carbon layer 118 may comprise a dielectric material such as silicon carbonate, or the like. Amorphous carbon layer 118 may be deposited using physical vapor deposition (PVD), CVD, plasma-improved chemical vapor deposition (PECVD), atmospheric pressure chemical vapor deposition (APCVD), low-pressure CVD (LPCVD), high density plasma CVD (HD CVD), atomic layer CVD (ALCVD), and/or other suitable processes.

Figure 6:
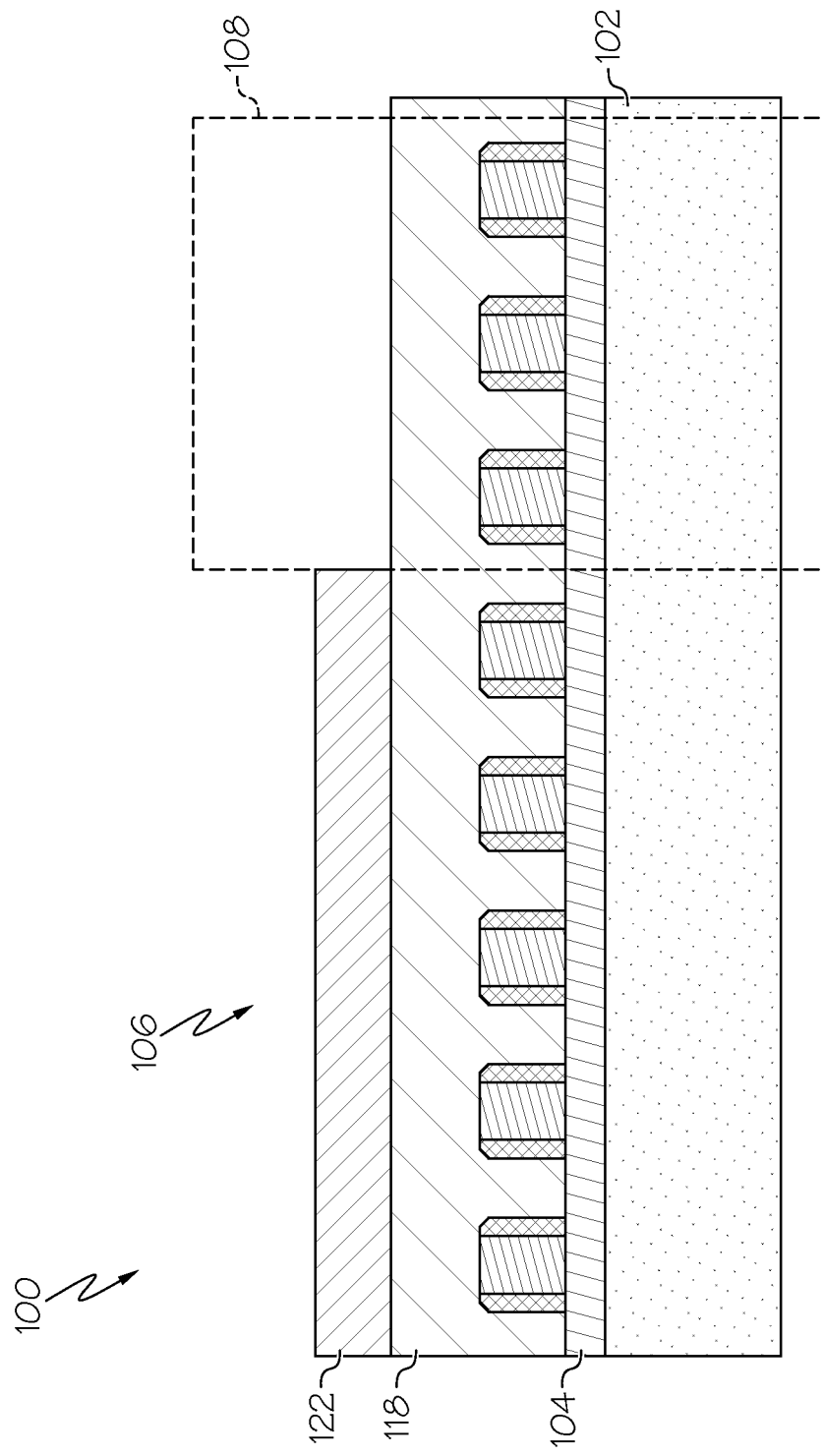
FIG. 6 shows a cross-sectional view of the formation of a photoresist layer over a portion of the device according to illustrative embodiments.

Referring now to FIG. 6, a photoresist (PR) 122 is applied to a portion of the surface of amorphous carbon layer 118 of device 100. For example, a region (subset) of device 100 can be designated as a metrology measurement area 108. The metrology measurement area 108 can be any subset of the substrate 102 that has been designated as not having a finned structure of a remainder region 106. To this extent, metrology measurement area 108 can be formed anywhere on device 100, including an edge region or an interior region. Furthermore, PR 122 can be patterned in such a manner as to create a plurality of contiguous and/or non-contiguous metrology measurement areas 108 on the same device. In any case, PR 122 can be applied to a subset of the surface of amorphous carbon layer 118 in remainder area 108 of device 100, exposed to a pattern of radiation, and then the pattern can be developed into PR 122 utilizing a resist developer. Once the patterning of PR 122 is completed, the sections covered by the photoresist are protected.

Figure 7:
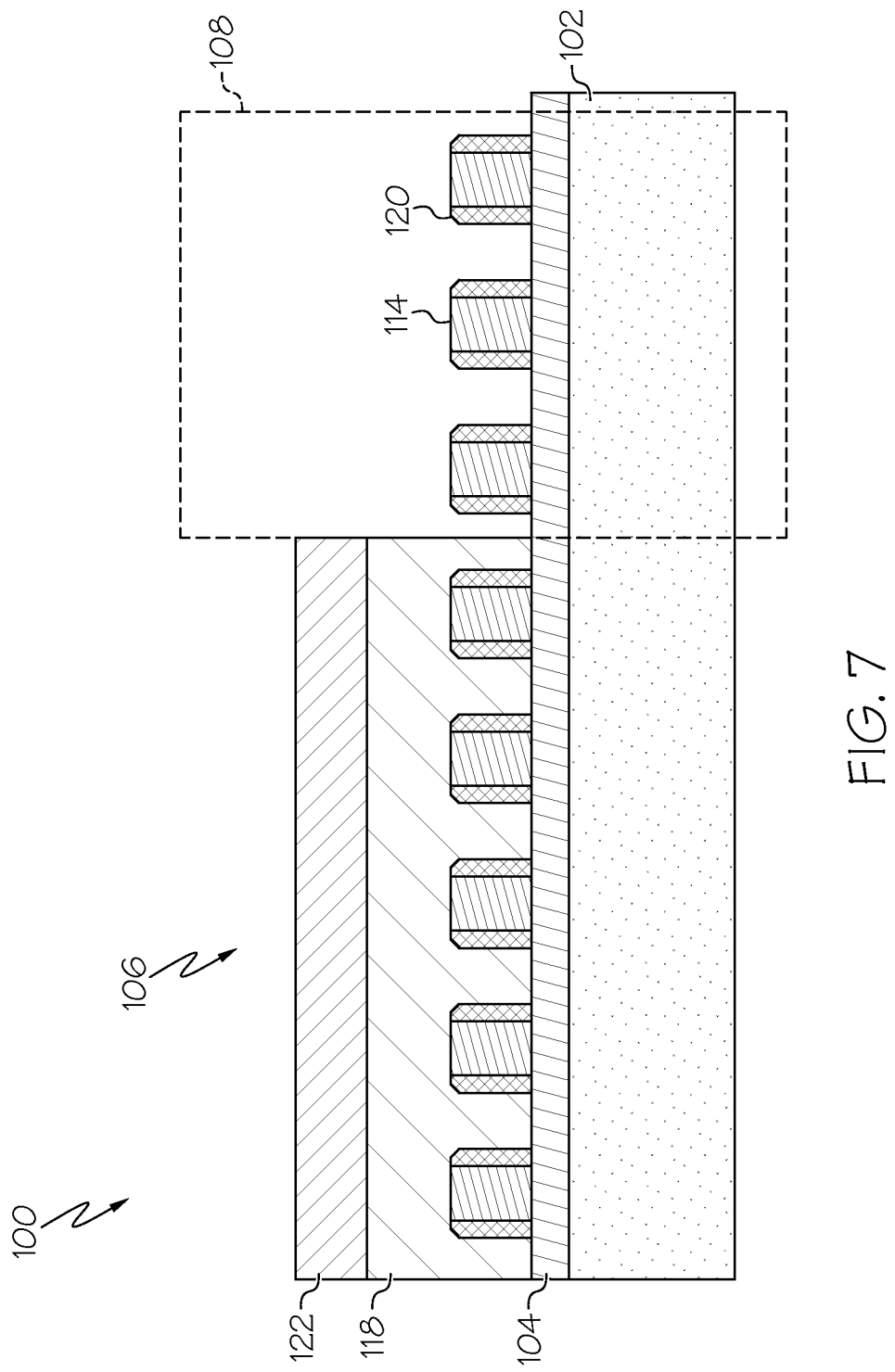
FIG. 7 shows a cross-sectional view of the partial removal of the amorphous carbon layer according to illustrative embodiments.
Figure 8:
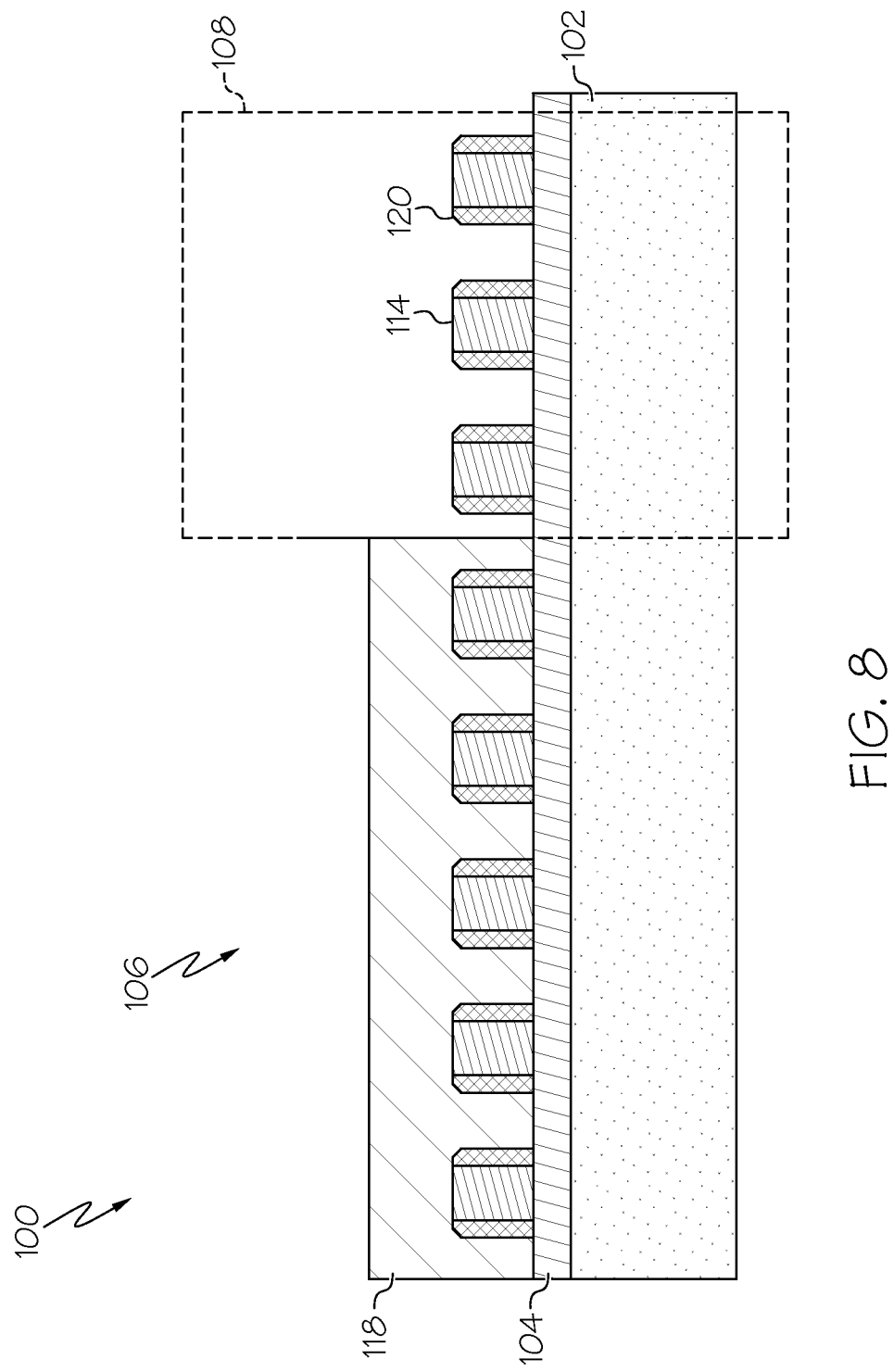
FIG. 8 shows a cross-sectional view of the removal of the photoresist layer according to illustrative embodiments.

Referring now to FIG. 7, the exposed regions of amorphous carbon layer 118 (e.g., within metrology measurement area 108) are removed using a selective etching process that removes the unprotected regions, leaving exposed the subset of the mandrel region 114 and set of spacers 120 in the metrology measurement area 108. The term "selective" in reference to a material removal process denotes that the rate of material removal for a first material is greater than the rate of removal for at least another material of the structure to which the material removal process is being applied. PR 122 may be removed using an $O_2$ ash process, or it may be stripped using a wet chemical process, as illustrated in FIG. 8.

Figure 9:
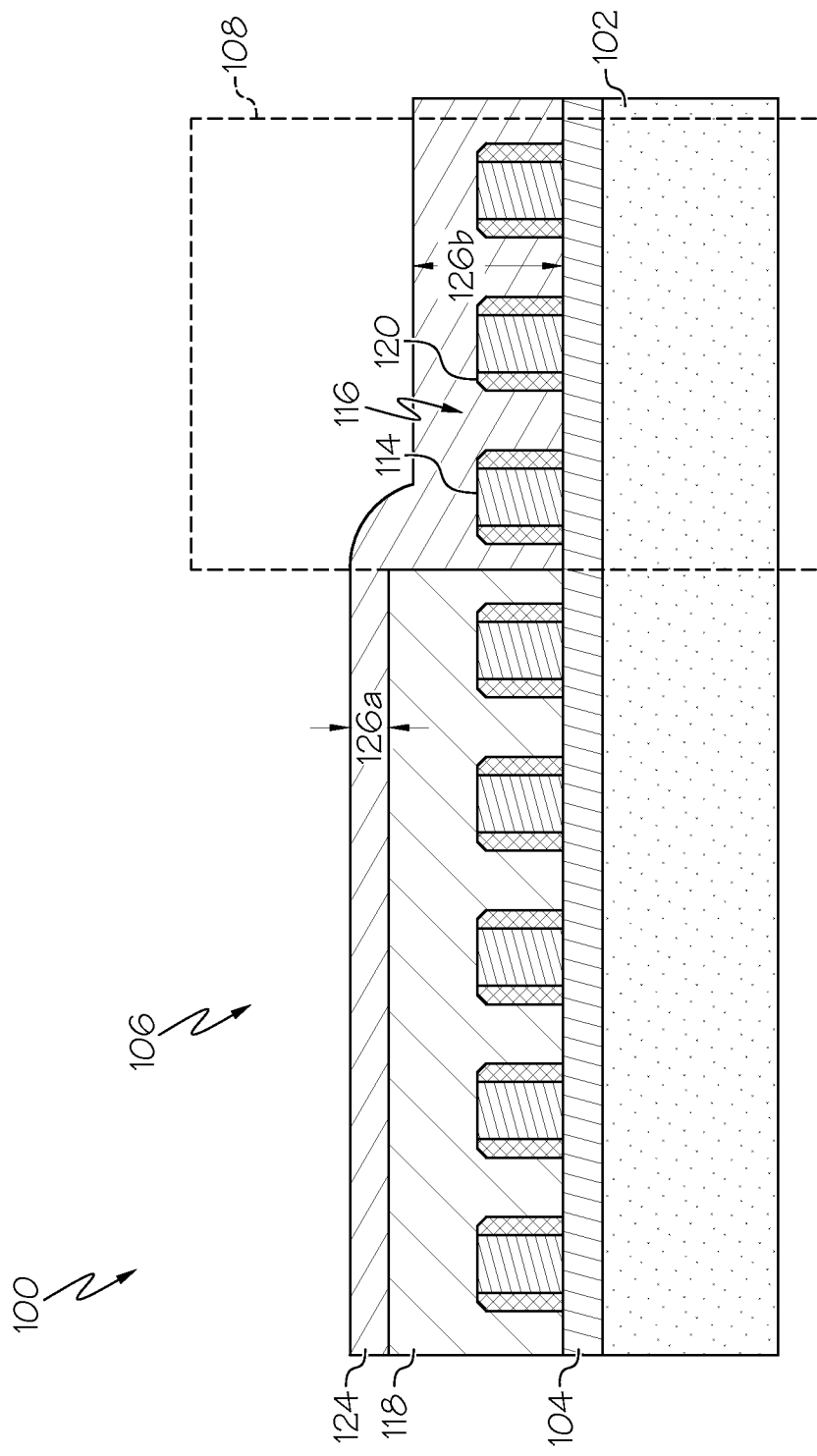
FIG. 9 shows a cross-sectional view of the formation of a pad hardmask according to illustrative embodiments.

Referring now to FIG. 9, a pad hardmask 124 is formed over device 100. In various embodiments, pad hardmask 124 can include a nitride, an oxide, SiON, SiOC (C-doped silicon oxide), and/or any other material which has an etch resistance that is similar to that of set of spacers 120. As shown, the remaining amorphous carbon layer 118 in the remainder area 106 (e.g., the subset of device 100 not in metrology area 108) has caused a difference in relative height between metrology measurement area 108 and remainder area 106. This difference in relative height allows the pad hardmask 124 to flow from the remainder area 106 into metrology measurement area 108 and fill the openings 116 in the mandrel layer 114 and set of spacers 120. As a result, a depth 126a of the pad hardmask 124 in the remainder area 106 is less than a depth 126b of the pad hardmask 124 in the metrology measurement area 108. To this extent, pad hardmask 124 may be deposited using physical vapor deposition (PVD), CVD, plasma-improved chemical vapor deposition (PECVD), atmospheric pressure chemical vapor deposition (APCVD), low-pressure CVD (LPCVD), high density plasma CVD (HD CVD), atomic layer CVD (ALCVD), and/or other suitable processes.

Figure 10:
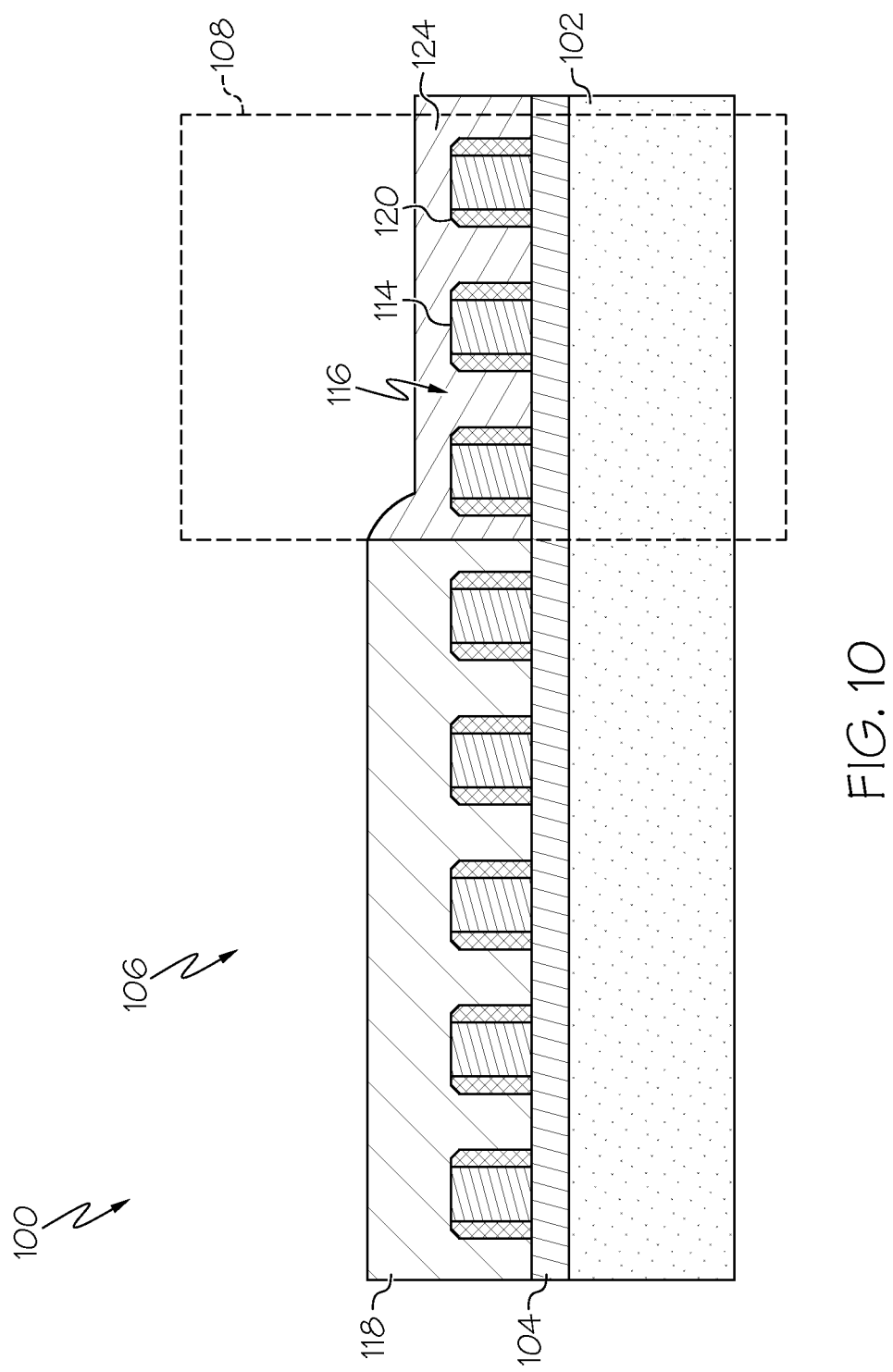
FIG. 10 shows a cross-sectional view of the partial removal of the pad hardmask according to illustrative embodiments.

Referring now to FIG. 10, pad hardmask 124 can be removed from over amorphous carbon layer 118 in remainder area 106 of device 100. This process can be performed using a blanket etch and/or any other suitable process. Because the depth 126a (FIG. 9) of the pad hardmask 124 is less in the remainder area 106 than the depth 126b (FIG. 9) in the metrology measurement area 108, the pad hardmask 124 can be removed from the remainder area 106 while leaving a remainder of the pad hardmask 124 in the metrology measurement area 108. As a result of this process, the metrology measurement area 108 and the remainder area 106 each have a different substance covering the mandrel layer 116 and set of spacers 120, with the pad hardmask covering the mandrel layer 116 and set of spacers 120 in the metrology measurement area 108 and the amorphous carbon layer 118 covering the mandrel layer 116 and set of spacers 120 in the remainder area 106.

Figure 11:
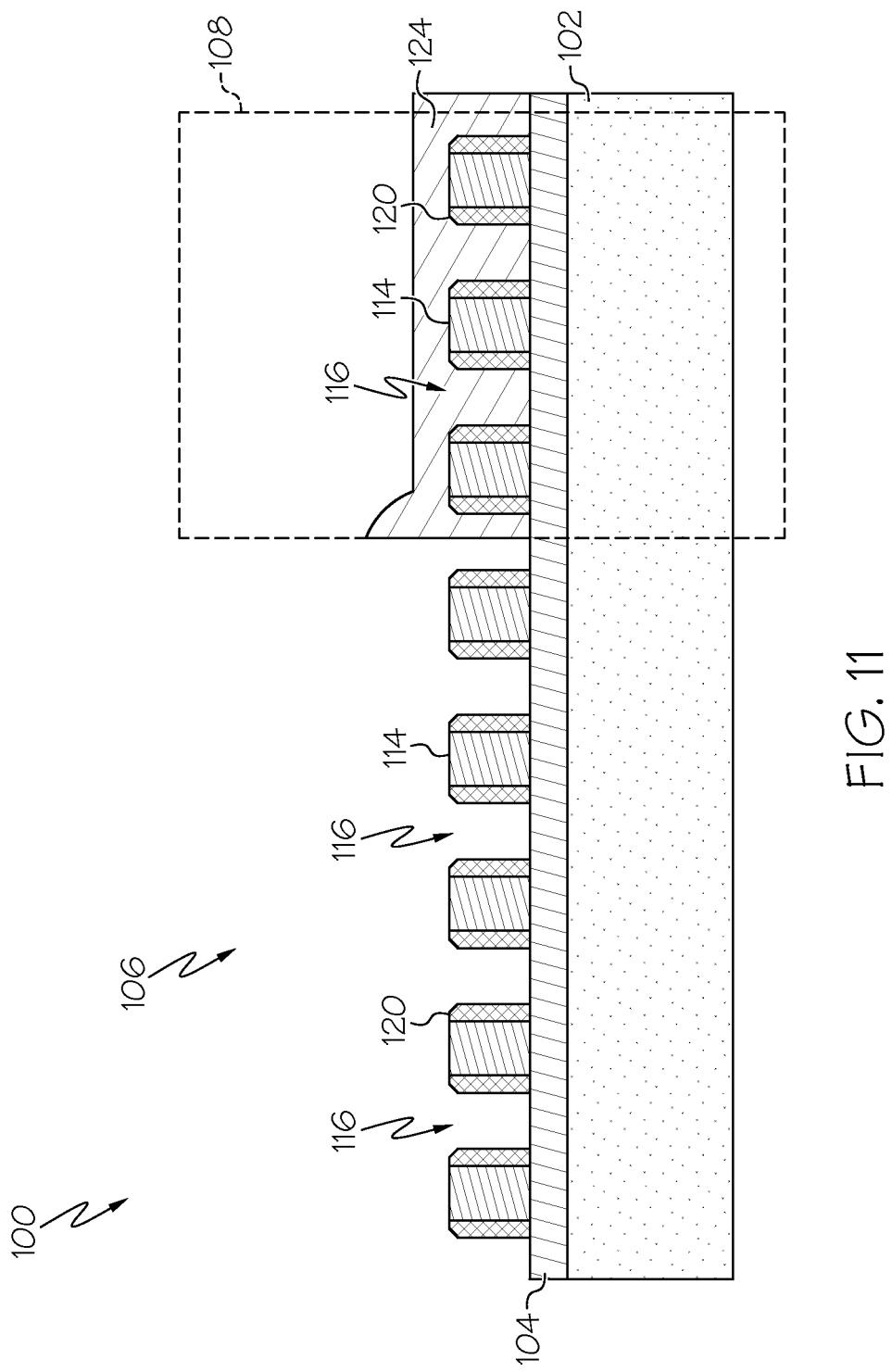
FIG. 11 shows a cross-sectional view of the removal of the remainder of the amorphous carbon layer according to illustrative embodiments.

Referring now to FIG. 11, amorphous carbon layer 118 is removed from over the mandrel layer 114 and set of spacers 120 in the remainder area 106 of device 100. This removal can be performed using a strip that is selective to the pad hardmask 124, removing the amorphous carbon layer 118 in the remainder area 106 while leaving the pad hardmask 124 intact in the metrology measurement area 108 while leaving the mandrel layer 114 and set of spacers 120 exposed in the remainder area 106 of device 100.

Figure 12:
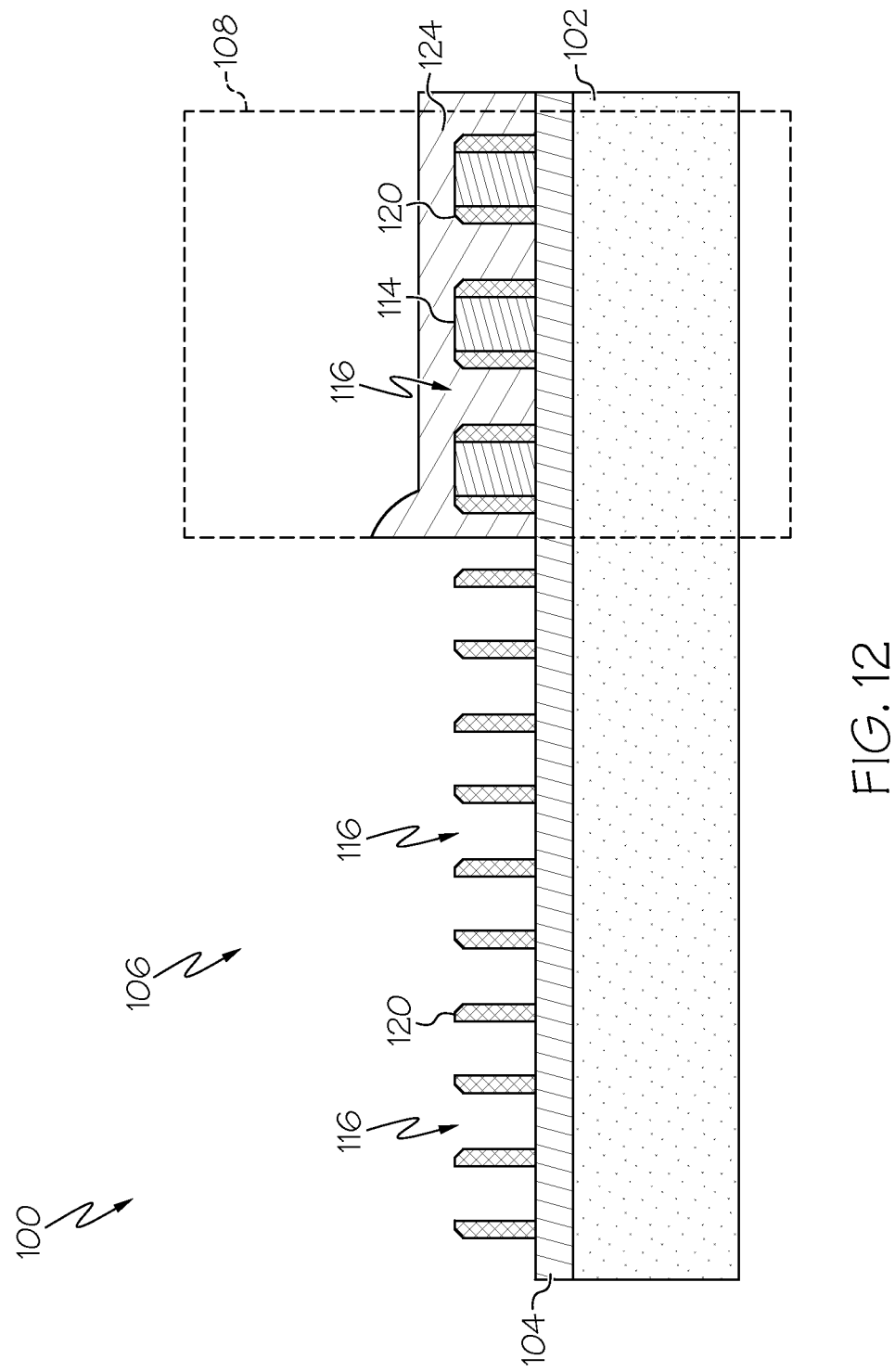
FIG. 12 shows a cross-sectional view of the device following partial removal of the mandrel layer from between the set of spacers according to illustrative embodiments.
Figure 13:
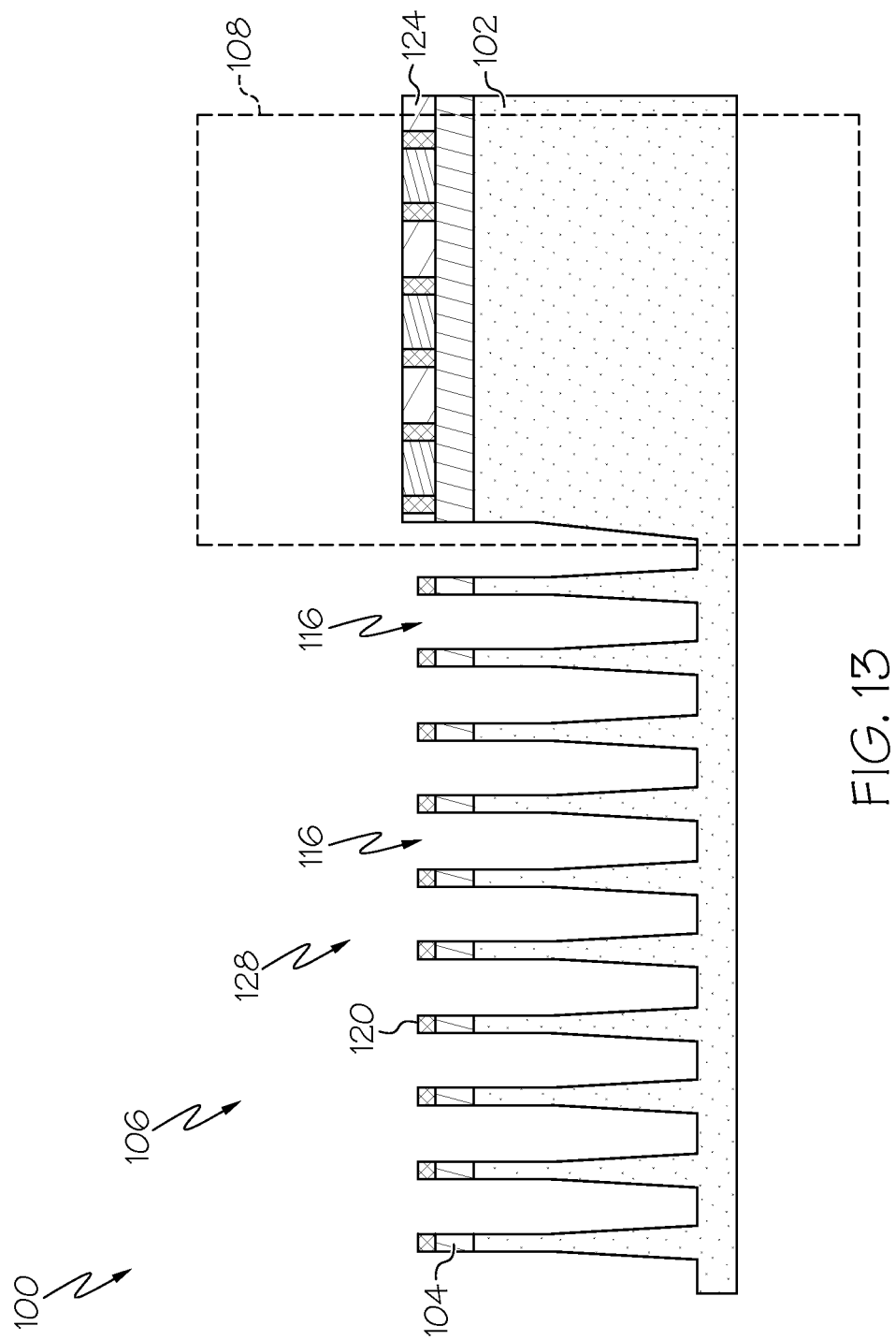
FIG. 13 shows a cross-sectional view of a set of fins patterned in the substrate according to illustrative embodiments.

Next, as shown in FIG. 12, mandrel layer 114 is removed from between the set of spacers 120 in pad area 104 the selective to hardmask 104. Then, as shown in FIG. 13, a fin etch process is performed and openings 116 are extended into substrate 102 to form set of fins 128. Here, the fin etch process does not impact the silicon of substrate 102 in the metrology measurement area 108 due to the presence of pad hardmask 124. Substrate 102 is preserved, thus allowing for the subsequent formation of a planar metrology pad 132 (FIG. 14).

Next, as shown in FIG. 14, an oxide 130 is deposited over device 100, filling openings 116. Oxide 130 may be formed using a high aspect ratio process such as PVD, CVD, PECVD, APCVD, LPCVD, HD CVD, ALCVD, and/or other suitable processes. In this embodiment, oxide 130 is deposited atop all of device 100, and then removed (e.g., via chemical mechanical planarization (CMP)). The planarization process also removes mandrel layer 114, set of spacers 120, pad hardmask 124, and hardmask 104 (FIG. 13) from metrology measurement area 108 to form planar metrology pad 132, which is suitable for metrology measurements and data extraction. As shown, planar metrology pad 132 comprises a flat, horizontal surface which can be oriented substantially perpendicular to set of fins 128. With this structure, planar metrology pad 132 provides a fin-free region to ensure that metrology techniques (e.g., ellipsometry, X-ray diffraction, X-ray reflectance, X-ray fluorescence, etc.) that rely on the existence of a uniform planar metrology pad can still be used, as there are no underlying fins 128 to be considered.

Although not shown for the sake of brevity, it is appreciated that gate electrode and gate dielectric layers are then patterned to form gate stacks over fins 128. The fin portions not under the gate stacks are then optionally doped to form doped drain and source regions. The dopant used depends on the conductivity type of the transistor. The doped regions may be doped by ion-implanting or by plasma doping where dopants are deposited onto the fin and annealed. Source and drain regions are formed across the gate stack. Source and drain regions may be formed by ion-implanting a source/drain region or by removing a portion of the fin and epitaxially re-growing the removed portion under doping conditions to form a source/drain region.

In various embodiments, design tools can be provided and configured to create the datasets used to pattern the semiconductor layers as described herein. For example, design tools can be used for: forming a first hardmask over a substrate; forming a photoresist over a portion of the first hardmask in a metrology measurement area of the device; removing the first hardmask in an area adjacent the metrology measurement area remaining exposed following formation of the photoresist; forming a second hardmask over the device; forming a mandrel layer over the second hardmask; forming a set of openings in the mandrel layer; forming a set of spacers within the set of openings; removing the mandrel layer selective to the second hardmask; removing the second hardmask; patterning a set of openings in the substrate to form a set of fins in the device in the area adjacent the metrology measurement area; depositing an oxide over the device; and planarizing the device to form a planar metrology pad in the metrology measurement area.

To accomplish this, data sets can be created to generate photomasks used during lithography operations to pattern the layers for structures as described herein. Such design tools can include a collection of one or more modules and can also be comprised of hardware, software, or a combination thereof. Thus, for example, a tool can be a collection of one or more software modules, hardware modules, software/hardware modules or any combination or permutation thereof. As another example, a tool can be a computing device or other appliance on which software runs or in which hardware is implemented. As used herein, a module might be implemented utilizing any form of hardware, software, or a combination thereof. For example, one or more processors, controllers, ASICs, PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

It is apparent that approaches have been described for providing a planar metrology pad adjacent a set of fins of a FinFET device. While the invention has been particularly shown and described in conjunction with exemplary embodiments, it will be appreciated that variations and modifications will occur to those skilled in the art. For example, although the illustrative embodiments are described herein as a series of acts or events, it will be appreciated that the present invention is not limited by the illustrated ordering of such acts or events unless specifically stated. Some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated. Therefore, it is to be understood that the appended claims are intended to cover all such modifications and changes that fall within the true spirit of the invention.

What is claimed is:

1. A method for forming a device, the method comprising:
    removing an amorphous carbon layer from over a mandrel formed on a subset of a substrate;
    forming a pad hardmask over the mandrel on the subset of the substrate, wherein the forming results in the pad hardmask covering the mandrel on the subset of the substrate and the amorphous carbon layer covering the mandrel on a remainder of the substrate;
    removing the amorphous carbon layer from over the mandrel on the remainder of the substrate; and
    forming a set of fins in the remainder of the substrate, wherein the amorphous carbon layer keeps the set of fins from being formed in the subset of the substrate.

2. The method according to claim 1, further comprising:
    forming a hardmask over the substrate;
    forming a mandrel layer over the hardmask;
    forming a set of openings in the mandrel layer;
    forming a set of spacers within the set of openings in the mandrel layer;
    removing, subsequent to the removing of the amorphous carbon layer, the mandrel layer selective to the hardmask; and
    performing an etch to form the set of fins.

3. The method according to claim 2, further comprising:
    removing, subsequent to the forming of the set of fins, the mandrel, the set of spacers, and the hardmask from over the subset of the substrate; and
    planarizing the subset of the substrate to form a planar metrology pad from the substrate surface adjacent to the set of fins.

4. The method according to claim 3, wherein the planar metrology pad is substantially flat and oriented substantially perpendicular to the set of fins.

5. The method according to claim 2, the removing of the mandrel layer further comprising etching the mandrel layer between each of the set of spacers.

6. The method according to claim 1, wherein the removal of the amorphous carbon layer from over the mandrel formed on the subset of the substrate further comprises:

depositing a photoresist over the amorphous carbon covering the remainder of the substrate;
performing an etch to remove the amorphous carbon layer; and
removing the photoresist.

7. The method according to claim 1, the forming of the pad hardmask further comprising:
depositing a low temperature flowable hardmask such that the flowable hardmask flows into spaces between the mandrel on the subset of the substrate; and
performing a blanket etch to remove the flowable hardmask from over the amorphous carbon layer over the remainder of the substrate.

8. The method according to claim 1, wherein the device is a fin field effect transistor device.

9. A method for forming a planar metrology pad on a substrate of a fin field effect transistor (FinFET) device, the method comprising:
removing an amorphous carbon layer from over a mandrel formed on a subset of a substrate;
forming a pad hardmask over the mandrel on the subset of the substrate, wherein the forming results in the pad hardmask covering the mandrel on the subset of the substrate and the amorphous carbon layer covering the mandrel on a remainder of the substrate;
removing the amorphous carbon layer from over the mandrel on the remainder of the substrate; and
forming a set of fins in the remainder of the substrate, wherein the amorphous carbon layer keeps the set of fins from being formed in the subset of the substrate.

10. The method according to claim 9, further comprising:
forming a hardmask over the substrate;
forming a mandrel layer over the hardmask;
forming a set of openings in the mandrel layer;
forming a set of spacers within the set of openings in the mandrel layer;
removing, subsequent to the removing of the amorphous carbon layer, the mandrel layer selective to the hardmask; and
performing an etch to form the set of fins.

11. The method according to claim 10, further comprising:
removing, subsequent to the forming of the set of fins, the mandrel, the set of spacers, and the hardmask from over the subset of the substrate; and
planarizing the subset of the substrate to form the planar metrology pad from the substrate surface adjacent to the set of fins.

12. The method according to claim 11, wherein the planar metrology pad is substantially flat and oriented substantially perpendicular to the set of fins.

13. The method according to claim 10, the removing of the mandrel layer further comprising etching the mandrel layer between each of the set of spacers.

14. The method according to claim 9, wherein the removal of the amorphous carbon layer from over the mandrel formed on the subset of the substrate further comprises:
depositing a photoresist over the amorphous carbon covering the remainder of the substrate;
performing an etch to remove the amorphous carbon layer; and
removing the photoresist.

15. The method according to claim 9, the forming of the pad hardmask further comprising:
depositing a low temperature flowable hardmask such that the flowable hardmask flows into spaces between the mandrel on the subset of the substrate; and
performing a blanket etch to remove the flowable hardmask from over the amorphous carbon layer over the remainder of the substrate.

* * * * *